United States Patent [19]

Gosswiller

[11] 4,100,380
[45] Jul. 11, 1978

[54] SUPERVISORY CIRCUIT FOR MONITORING SPEAKER COILS

[75] Inventor: Earl W. Gosswiller, Clarendon Hills, Ill.

[73] Assignee: Federal Signal Corporation, Oak Brook, Ill.

[21] Appl. No.: 666,409

[22] Filed: Mar. 12, 1976

[51] Int. Cl.² .......................................... H04R 29/00
[52] U.S. Cl. ........................ 179/175.1 A; 179/1 MN; 340/652
[58] Field of Search ..... 179/175.1 A, 1 MN, 175.3 R; 340/248 E, 251, 253 A, 253 B, 256

[56] References Cited

U.S. PATENT DOCUMENTS

| | | | |
|---|---|---|---|
| 3,634,820 | 1/1972 | Birtwistle | 340/251 |
| 3,656,158 | 4/1972 | Goodwater | 340/253 B |
| 3,849,772 | 11/1974 | Burnett | 340/253 A |
| 3,855,415 | 12/1974 | Fox et al. | 179/1 MN |
| 3,912,883 | 10/1975 | Goodyear | 179/175.3 R |
| 3,956,733 | 5/1976 | Sakurai | 340/251 |
| 3,965,456 | 6/1976 | Schwellenbach | 340/251 |

*Primary Examiner*—Douglas W. Olms
*Attorney, Agent, or Firm*—Charles F. Pigott, Jr.

[57] ABSTRACT

In a system with a plurality of loud speaker enclosures, a supervisory system is provided to monitor the speaker coils. Each enclosure has a relay, and the relay winding is series-coupled with the speaker coil, to maintain the relay contact set closed when there is continuity in the speaker coil. A fuse, also series-coupled with the relay winding and speaker coil, is sized to blow when the speaker coil shorts and reduces the series circuit impedance. Accordingly either the speaker coil open condition or the speaker coil shorted condition effects de-energization of the relay winding and releases the normally-closed contact set to signal the speaker coil trouble condition.

6 Claims, 2 Drawing Figures

SUPERVISORY CIRCUIT FOR MONITORING SPEAKER COILS

BACKGROUND OF THE INVENTION

Various types of voice alarm and public address systems have a plurality of loud-speaker enclosures which, when driven by an audio amplifier, can provide entertainment such as music or information programs. Such systems are generally arranged so that the loud-speakers can be disconnected from the ordinary entertainment signals and utilized to provide emergency information, such as a fire alarm signal. When used to provide fire alarm or similar important signals, even on a standby basis, it becomes important to effect periodic circuit checks to ensure that the speakers are in suitable operating condition. This is normally done by a "supervisory" circuit of some type which monitors the condition of the speaker. It is desirable to determine whether the speaker coil may have been shorted since the last supervision check, or whether it may have become open-circuited.

Various approaches to the supervisory problem have been attempted. Sometimes high-frequency signals, above the audio-frequency range, have been applied over the speaker system. Although inaudible to human beings, such signals can be disturbing to pets and other animals. Another approach is to utilize a dual voice coil in each speaker, where one of the coils normally drives the speaker diaphragm and the other coil is magnetically coupled to the first coil. In this way the normal driving coil can induce a signal in the second coil, and the induced signal is monitored for supervisory purposes. However this is inefficient from the power dissipation standpoint.

It is therefore a primary object of the present invention to provide a supervisory circuit for monitoring speaker systems which does not disturb pets or other animals, and which is more efficient than know supervision systems.

It is a more specific object of this invention to provide a simple and economical supervisory circuit which is effective to detect and indicate the presence of either an open coil condition or a shorted coil condition within a speaker enclosure.

SUMMARY OF THE INVENTION

A supervisory circuit constructed in accordance with the present invention is useful in the monitoring of a speaker coil condition. The circuit of the invention includes a relay, which has a winding and a normally-closed contact set. The relay winding is series-coupled with the speaker coil, thus maintaining the relay contact set closed when a potential difference is applied across the series circuit through the supervisory circuit. Thus whenever the supervisory potential is applied, closure of the contact set indicates continuity through the speaker coil; if the contact set is opened, a trouble indication is automatically signalled.

In accordance with another aspect of the invention, the relay winding is electrically "sized" to have an effective impedance substantially smaller than the impedance exhibited by the speaker coil. Further a fuse is coupled in series with the relay winding and the speaker coil. The fuse is sized such that, when the speaker coil is shorted there is such a substantial reduction of the total impedance in the series circuit that the fuse is blown. This interrupts the series circuit, and releases the contact set to indicate the trouble condition.

THE DRAWING

In the drawing, like reference numerals identify like components, and in that drawing:

FIG. 1 is a simplified showing of a single supervisory circuit in accordance with this invention; and FIG. 2 is a simplified schematic illustration of a plurality of speaker enclosures connected to be monitored by the supervisory circuit of the present invention.

DETAILED DESCRIPTION OF THE INVENTION

Figure 1:
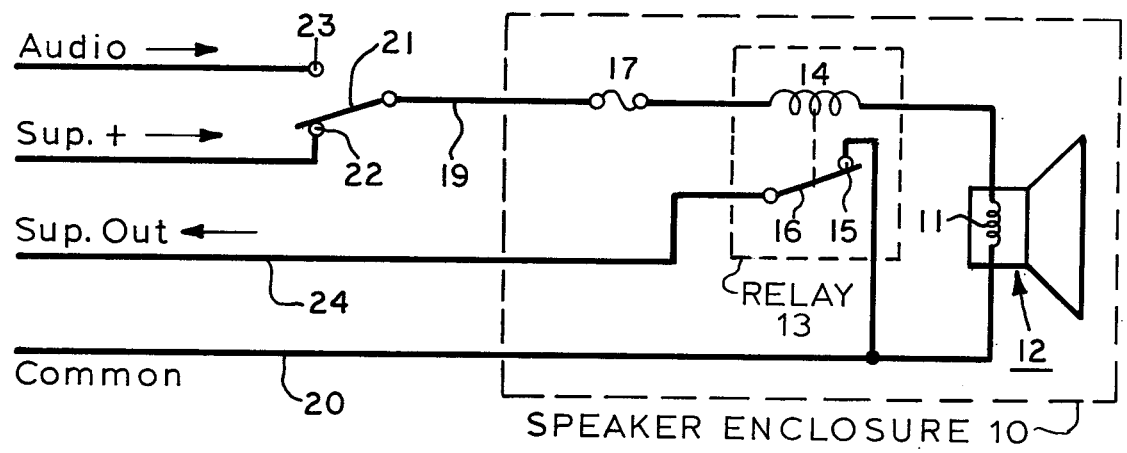

FIG. 1 depicts a conventional speaker arrangement within an enclosure 10, and the associated circuitry for both driving the speaker and supervising the coil 11 within speaker assembly 12. In accordance with the present invention a relay assembly 13 is provided. The relay includes a winding 14, a fixed contact 15 and a movable contact 16 which is in the normally closed position as illustrated when current flows through relay winding 14. A fuse 17 is coupled in a series circuit with relay winding 14 and speaker coil 11, between conductors 19 and 20. Conductor 20 is the common or system ground conductor, and conductor 19 is coupled to a movable contact 21, shown engaging a fixed contact 22 and displaceable to engage another fixed contact 23 when the normal audio input signal is received. The other conductor 24 is coupled to the movable contact 16 of the relay structure, to provide an output signal in the supervisory mode of the equipment.

In the normal operating condition, audio input signals are received at contact 23 and passed over the movable switch contact 21, fuse 17 and relay coil 14 to drive the speaker coil 11. In the supervisory mode, movable switch 21 is displaced to engage contact 22 as shown, and a low d-c voltage (for example, 24 volts) is applied over contacts 22, 21 and input conductor 19 to the series circuit including the fuse, relay winding and speaker coil. Thus for purposes of this description the conductors 19, 20 are considered as means for applying a potential difference across the series circuit. Any suitable energizing potential difference can be applied to produce current flow through the series circuit and energize relay 13. If speaker coil 11 is open, there is no current flow through relay winding 14, and the contact set 15, 16 will be open. With no common or ground signal on conductor 24, this indicates the trouble condition to the supervisory equipment.

In accordance with another aspect of the invention, the impedance of speaker coil 11 is made much larger than the normal 8 or 16 ohm impedance generally found in such units. When it is made much larger than the impedance of relay winding 14, and the fuse 17 is sized so that upon shorting of the speaker coil the series impedance is substantially reduced, the current flow will be substantially increased, well above the rating of the fuse. Thus the fuse is blown providing for de-energization of the relay 13 to open the contact set 15, 16. In this way a simple, economical circuit arrangement provides for indicating the open or shorted condition of the speaker coil, with the addition of only a relay and a low-cost fuse. Moreover, by making the speaker coil impedance much greater (preferably by a 10:1 ratio) than the impedance of the relay winding, not only can an inexpensive fuse be employed, but also looking into the series circuit from the audio amplifier (not shown), the impedance of the relay winding is negligible.

Figure 2:
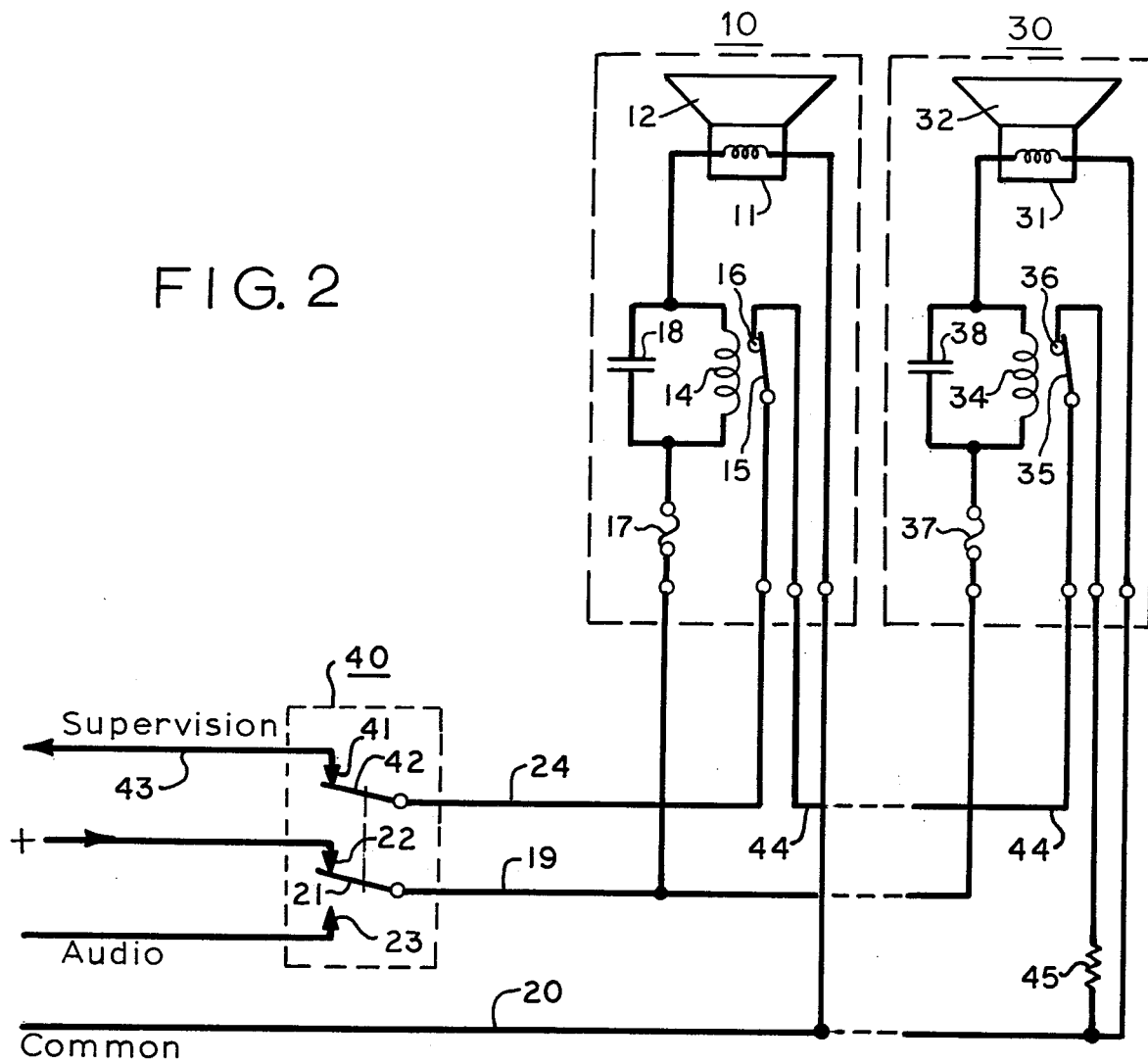

FIG. 2 depicts a system interconnection of a plurality of speaker enclosures, with only the first enclosure 10 and the last enclosure 30 being illustrated. In general the showing within enclosure 10 is the same as that of FIG. 1, with the addition of a capacitor 18, shown coupled in parallel with the relay winding 14. Within speaker enclosure 30, speaker coil 31 is in the speaker assembly 32, and relay assembly 33 includes a winding 34 and a contact set 35, 36, similar to that already described in connection with the first enclosure. Fuse 37 and capacitor 38 are similarly connected in the enclosure of speaker assembly 30. Each of the speaker enclosures has four terminals or simple connections for facilitating coupling of the system conductors to the enclosure structure.

At the left of FIG. 2 a supervisory switch assembly 40 is shown. As there shown this switch includes the contact set 21, 22 and 23 connected in a manner similar to that already explained with relation to FIG. 1. In addition another contact set including fixed contact 41 and movable contact 42 is provided to couple the supervisory output line 24 to conductor 43 for passing the common or ground signal to associated equipment, such as a pilot light or relay winding, to indicate that the supervisory series circuit is complete and all the speaker coils are in good condition.

When the push-to-monitor switch 40 is displaced and the contacts are in the position illustrated, the supervisory series circuit is completed from conductor 43 over contacts 41, 42, conductor 24, contact set 15, 16 within enclosure 10, jumper conductor 44 between the first and last enclosures 10 and 30, contact set 35, 36 within enclosure 30, and end-of-line resistor 45 to the common conductor 20. The end-of-line resistor is used to provide an impedance match with the supervisory monitoring equipment coupled to conductors 43 and 20. If any of the speaker coils is open, its associated relay winding will not be energized and the relay contact set will be open to interrupt the supervisory series circuit. Similarly if any of the speaker coils has become shorted, the high current resulting from the reduced series impedance in that enclosure will blow the fuse such as 17 or 37, de-energizing the associated relay and again interrupting the supervisory series circuit.

The circuit of the invention was operated satisfactorily with a speaker coil impedance of 275 ohms and a relay winding impedance of 25 ohms. A potential difference of 24 volts d-c was applied between conductors 19, 20 in the illustrated position of push-to-monitor switch 40, and fuse 17 was rated at ⅛ amp. Capacitor 18 was a 10 microfarad capacitor. These practical values are provided solely to assist those skilled in the art to practice the invention with a minimum of experimentation, and in no sense are to be considered a constraint on the inventive concept.

In the appended claims "connected" means a d-c connection between two components with virtually zero d-c resistance between those components. The term "coupled" indicates there is a functional relationship between two components, with the possible interposition of other elements between the two components described as "coupled" or "intercoupled".

While only a particular embodiment of the invention has been described and claimed herein, it is apparent that various modifications and alterations of the invention may be made. It is therefore the intention in the appended claims to cover all such modifications and alterations as may fall within the true spirit and scope of the invention.

What is claimed is:

1. A supervisory circuit for monitoring the condition of a speaker coil, comprising:
    a relay, having a winding and a contact set, which relay winding is coupled in a series circuit with the speaker coil, said relay winding having an impedance of given value and the impedance of the speaker coil being substantially greater than said given value; and
    means for applying a potential difference across the series circuit, to maintain the contact set in a given position when current flows through the series circuit of the relay winding and the speaker coil, such that upon opening of the speaker coil, the contact set drops out of the given position to indicate a trouble condition.

2. A supervisory circuit for monitoring the condition of a speaker coil, comprising:
    a relay, having a winding and a contact set, which relay winding is coupled in a series circuit with the speaker coil, said relay winding having an impedance of given value and the impedance of said speaker coil being substantially greater than said given value;
    means for applying a potential difference across the series circuit, to maintain the contact set in a given position when current flows through the series circuit of the relay winding and the speaker coil, such that upon opening of the speaker coil, the contact set drops out of the given position to indicate a trouble condition; and
    a fuse, coupled in series with the relay winding and the speaker coil, said fuse being sized such that, upon shorting of the speaker coil to reduce the impedance in series with the fuse, the current flow through the series circuit increases sufficiently to blow the fuse and interrupt the series circuit, thus allowing the contact set to drop out and indicate the trouble condition.

3. A supervisory circuit for monitoring the conditions of the speaker coils of a plurality of speakers, comprising:
    a plurality of relays, each having a winding and a contact set, with the winding of one relay being coupled in a series circuit with one speaker coil to monitor only that coil, with the impedance of the speaker coil being substantially larger than the impedance of the relay winding;
    means for coupling the contact sets of all the relays so as to provide a first signal when the relays are energized and a different signal when the relays are not energized;
    means, including a monitor switch, for applying a d-c voltage to all the series circuits, thus energizing the relays and actuating their associated contact sets; and
    means for determining whether all the contact sets have been actuated.

4. A supervisory circuit as claimed in claim 3, and further comprising a plurality of fuses, one coupled in a series circuit with each relay winding and speaker coil, each fuse being sized such that, upon shorting of the series-coupled speaker coil to reduce the impedance in the series circuit with the fuse, the current flow through such series circuit increases sufficiently to blow the fuse and interrupt the series circuit, thus allowing the relay contact set to be de-actuated and indicate a trouble condition.

5. A supervisory circuit for monitoring the condition of the speaker coil in each of a plurality of speaker enclosures, comprising:
- a plurality of relays, each having a winding and a contact set, with one relay being mounted in each speaker enclosure and the relay winding being coupled in a series circuit with a speaker coil in that same enclosure;
- a common conductor, coupled to one side of each series circuit including the relay winding and speaker coil;
- an input conductor, coupled to the other side of each series circuit;
- a supervisory arrangement, including an output conductor coupled to the contact set of the relay in the first enclosure, means for completing a series circuit between the contact set in the first enclosure and the contact set in the next enclosure, and means including an end-of-line resistor coupled between the contact set in the last enclosure and the common conductor to complete the supervisory arrangement; and
- means, including a monitor switch, for applying a d-c supervisory voltage between the input and common conductors, thus energizing the relays in all the speaker enclosures and completing a series circuit in the supervisory arrangement to indicate continuity in all the speaker coils.

6. A supervisory circuit as claimed in claim 5, in which the relay winding in each enclosure has an impedance of given value and the impedance of the speaker coil in each enclosure is substantially greater than said given value, and further comprising a plurality of fuses, one fuse being coupled in series with the relay winding and the speaker coil in each enclosure, which fuses are sized such that, upon shorting of any speaker coil to reduce the total impedance in series with the fuse, the current flow through the series circuit increases sufficiently to blow the fuse and interrupt the series circuit in that enclosure, thus opening the contact set to indicate the trouble condition.

* * * * *